(12) United States Patent
Tomar

(10) Patent No.: US 10,381,831 B2
(45) Date of Patent: Aug. 13, 2019

(54) SYSTEM AND METHOD FOR DIGITAL ENERGY METERING AND CONTROLLING APPLIANCES

(71) Applicant: Yuvraj Tomar, Meerut (IN)

(72) Inventor: Yuvraj Tomar, Meerut (IN)

(73) Assignee: Yuvraj Tomar, Uttar Pradesh (IN)

( * ) Notice: Subject to any disclaimer, the term of this patent is extended or adjusted under 35 U.S.C. 154(b) by 138 days.

(21) Appl. No.: 15/103,545

(22) PCT Filed: Dec. 9, 2014

(86) PCT No.: PCT/IN2014/000763
§ 371 (c)(1),
(2) Date: Jun. 10, 2016

(87) PCT Pub. No.: WO2015/107538
PCT Pub. Date: Jul. 23, 2015

(65) Prior Publication Data
US 2016/0315470 A1    Oct. 27, 2016

(30) Foreign Application Priority Data

Dec. 10, 2013   (IN) .......................... 3203/MUM/2013

(51) Int. Cl.
| | |
|---|---|
| *G01R 19/25* | (2006.01) |
| *G01R 22/06* | (2006.01) |
| *G05B 13/02* | (2006.01) |
| *H02J 3/00* | (2006.01) |
| *G06Q 50/06* | (2012.01) |
| *H04W 4/80* | (2018.01) |

(52) U.S. Cl.
CPC ............ *H02J 3/00* (2013.01); *G01R 19/2513* (2013.01); *G01R 22/063* (2013.01); *G05B 13/0265* (2013.01); *G06Q 50/06* (2013.01); *H04W 4/80* (2018.02)

(58) Field of Classification Search
CPC .............. G01R 19/2513; G01R 22/063; G05B 13/0265; G06Q 50/06; H02J 3/00; H04W 4/80
See application file for complete search history.

(56) References Cited

U.S. PATENT DOCUMENTS

| | | | | |
|---|---|---|---|---|
| 7,209,840 | B2 * | 4/2007 | Petite ...................... | G01D 4/004 |
| | | | | 340/870.02 |
| 7,346,463 | B2 * | 3/2008 | Petite ...................... | G08C 17/02 |
| | | | | 340/870.02 |
| 8,600,574 | B2 * | 12/2013 | Hamilton, II ............. | G06F 1/30 |
| | | | | 700/286 |
| 9,513,648 | B2 * | 12/2016 | Forbes, Jr. .............. | G05B 19/02 |
| 9,563,215 | B2 * | 2/2017 | Forbes, Jr. ................ | H02J 3/32 |
| 9,806,563 | B2 * | 10/2017 | Forbes, Jr. .............. | G05B 19/02 |

* cited by examiner

*Primary Examiner* — Abdelmoniem I Elamin
(74) *Attorney, Agent, or Firm* — Barry Choobin; Patent 360 LLC

(57) ABSTRACT

The present invention provides a method for monitoring and controlling power consumption at plurality endpoints. The method comprises, receiving raw data from plurality of endpoints, processing the raw data received from the plurality of the endpoints, communicating the processed data to a database using one or more protocols, interpreting the processed data into one or more events, measuring the power consumed by the plurality of the endpoints using the interpreted data; and controlling the power consumption of the plurality of the endpoints using one or more applications.

9 Claims, 17 Drawing Sheets

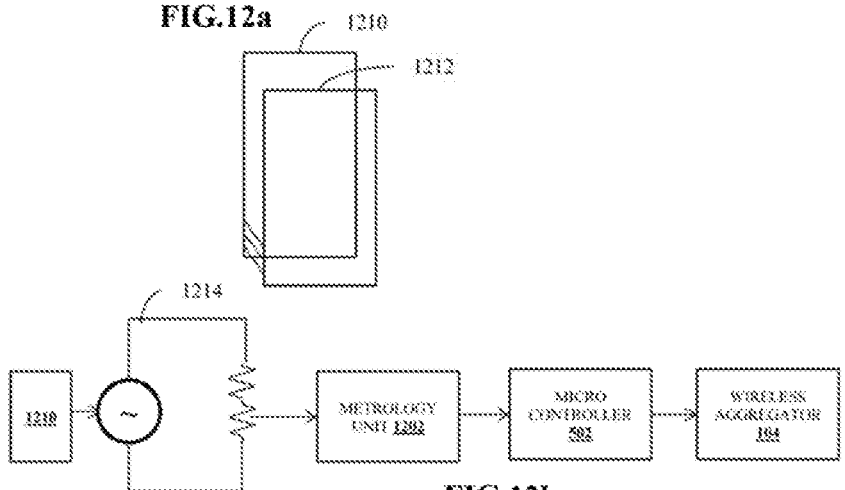
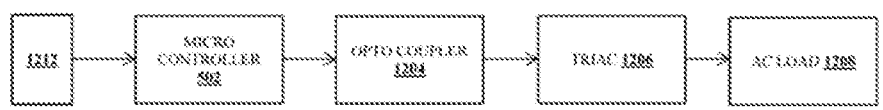

SYSTEM AND METHOD FOR DIGITAL ENERGY METERING AND CONTROLLING APPLIANCES

CROSS REFERENCE TO RELATED APPLICATION

The application is a National Phase Application filed with respect to the PCT Application No PCT/IN2014/000763 filed on Dec. 9, 2014 with the title "A SYSTEM AND METHOD FOR DIGITAL ENERGY METERING AND APPLIANCE CONTROL". The application further claims the priority of the Indian Provisional Patent Application with No. 3203/MUM/2013 filed on Oct. 10, 2013 post dated by two months with to Dec. 10, 2013 the title "LOW COST END POINT DIGITAL ENERGY METERING AND CONTROL OF COMMON HOUSEHOLD APPLIANCES USING WIRELESS NETWORK AND CLOUD TECHNOLOGY". The contents of the above mentioned applications are incorporated in its entirety by reference herein.

BACKGROUND

Technical Field

The present invention relates to methods and systems for monitoring and controlling power consumption. In particular, the present invention relates to monitoring and controlling power consumption using one or more applications.

Description of the Related Art

Energy metering is a measure of the consumption of energy. Generally energy metering is done for recording energy consumption, distribution of energy, understand the costs, and to understand the usage pattern. Customarily, energy metering is done only at the supply side of the energy. The customary energy metering systems informs the overall energy consumption of the household. However, it does not breakdown the consumption per endpoints. To understand energy consumption, and to save power consumption, it is essential to know the consumption of power by individual end point. Analysing the individual energy consumption over a period is vital for taking energy saving decision.

It is essential to have an energy measurement system at individual end point to manage energy consumption. Conventional energy measurement systems have memory units along with the measuring hardware. The memory units record the consumption of the individual endpoint. However, the amount of data recorded by the memory units is limited. Further, having plurality of memory units at individual endpoints is not desirable as it increases the cost of the solution, maintainability and scalability.

In light of the above discussion, there is a method and system for overcoming the above mentioned disadvantages.

The above mentioned shortcomings, disadvantages and problems are addressed herein, as detailed below.

The primary object of the invention is to provide energy metering of each individual endpoint at the demand side.

Yet another object of the invention is to control the individual endpoint using a centralized server, and using another endpoint that is different from the first individual endpoint.

Yet another object of the invention is to provide a method for learning user consumption pattern for a scheduled and automatic control of the individual endpoint.

Yet another object of the invention is to reduce the cost of the endpoint hardware.

Yet another object of the invention is to increase the scalability of the energy metering system.

Yet another object of the invention is to control the individual end point using web and mobile applications.

The above mentioned objects and other advantages will be understood by reading and studying the following specification.

SUMMARY

According to one embodiment herein, a method is provided for centralised monitoring and controlling power consumption of end user devices in network. The method comprising steps of receiving a raw data from plurality of end points using a data collecting devices, wherein the plurality of end points are connected with a plurality of operating devices or end user devices; measuring a plurality of operating and environmental parameters of the end user devices with a plurality of sensors; collecting and storing the received raw data and the measured plurality of operating and environmental parameters in a data aggregator device, processing the received raw data from the plurality of endpoints and the measured operating and environmental parameters with a microcontroller unit; interpreting the processed data into one or more events with the microcontroller unit; measuring a power consumption of the plurality of end points using the microcontroller unit; optimizing and controlling the power consumption of the plurality of end points based on a preset setting and the measured and processed operating and environmental parameters using the microcontroller unit; and communicating the processed raw data and the measured operating and environmental parameters for storage in a database using one or more communication protocols for future retrieval and usage.

According to one embodiment herein, the raw data includes a power consumption data, load data, power factor data, usage pattern over a monitoring time interval.

According to one embodiment herein, the measured operating and environmental parameters includes a current consumption, voltage level, environment temperature, humidity, ambient light flux, meteorological conditions, infra sonic frequency data infrared transceiver data gesture data voice input, magnetic contact sensor data, motion sensor data and door and window contact sensing data.

According to one embodiment herein, the processed raw data and the measured operating and environmental parameters are communicated using wireless and wired networks.

According to one embodiment herein, the processed raw data and the measured operating and environmental parameters are stored in a cloud and in a local gateway.

According to one embodiment herein, the end points are controlled in a centralised manner.

According to one embodiment herein, the microcontroller unit is stored with a plurality at applications to process the received raw data and measured operating and environmental parameters and to optimise and control the power consumption of the plurality of end points.

According to one embodiment herein, the power consumption is controlled through a web application or a mobile application or an third party application.

According to one embodiment herein, the step of processing the plurality of raw data comprises providing a unique global identifier for each endpoint device; associating the data collected from the endpoint with the unique global identifier assigned to a respective end point device; mapping each unique global identifier of the endpoint device with the processed data corresponding to the end point device on a gateway device and a cloud server.

According to one embodiment herein, the method anther generates a historical data, and a statistical data related a to a sensor data input related to each end point device.

According to one embodiment herein, a system is provided for monitoring and controlling power usage using one or more applications. The system comprises a plurality of data collecting devices connected to a plurality of end points connected to a plurality of operating devices or end user devices, wherein the plurality of data collecting devices receive a raw data from the plurality of operating devices; a plurality of sensors for measuring a plurality of operating and environmental parameters of the end user devices; a plurality of wired or wireless data aggregators for collecting and procession the raw data received from the plurality of end points and the plurality of measured operating and environmental parameters of the end user devices; one or more gateway devices for communicating between the plurality of wired or wireless data aggregators; and a cloud server for processing the raw data received from the plurality of end points and the plurality of measured operation and environmental parameters of the end user devices received from one or more gateway devices to optimize and control a power consumption of the plurality of end user devices.

According to one embodiment herein, the wireless or wired data aggregator comprises a personal area network manager for controlling a communication between the plurality of end user devices; and an end point interface manager and multiplexer, for interfacing with the plurality of the end points for collecting and forwarding the raw data received from the plurality of end user devices.

According to one embodiment herein, the gateway device comprises a cloud interface, in communication with the cloud database for accessing the data stored in the cloud database; a timer, for invoking one or more timed and scheduled events; a microcontroller, in communication with the plurality of wired or wireless data aggregators, configured for processing the plurality of raw data and the plurality of measured operating and environmental parameters of the end user devices; a control interface, in communication with the plurality of wired or wireless data aggregators, configured for interfacing with plurality of the end user devices; an input/output interface, for transferring the collected data between an internal storage device and an external storage device; a rule engine, for defining one or more actions on the plurality of the end user devices, wherein the plurality of actions are defined and estimated based on the plurality of raw data and the plurality of measured operating and environmental parameters of the end user devices; a localized machine learning module for controlling the plurality of end user devices automatically, based on the actions defined corresponding to a usage pattern; and a micro web server, in communication with the plurality of communication devices, for modifying the rules defined by the rule engine.

According to one embodiment herein, the cloud server comprises a main data storage module, for storing the plurality of data received from plurality of wired or wireless data aggregators, the data received from the plurality of end user devices and the data received from the plurality of gateway devices; an aggregate data storage module, for storing the aggregated data received from the main data storage module at a periodic time intervals; an off-line machine learning module, for controlling one or more endpoints automatically, understanding the usage patterns and trends from a stored historical data; a reporting and querying module, for generating reports and queries; and API based interface, for defining a point of contact for all cloud related activities.

According to one embodiment herein, the raw data includes a power consumption data load data, power factor data, usage pattern over a monitoring time interval, and wherein the measured operating and environmental parameters includes a current consumption, voltage level, environment temperature, humidity, ambient light flux, meteorological conditions, infra sonic frequency data, infrared transceiver data, gesture data voice input, magnetic contact sensor data, motion sensor data, and door and window contact sensing data.

The present invention provides a system and method for monitoring and controlling the power consumption at domestic and industrial setting. The present invention provides a method for monitoring and controlling power consumption at plurality endpoints. The method comprises, receiving raw data from plurality of endpoints, processing the raw data received from the plurality of the endpoints, communicating the processed data to a database using one or more protocols, interpreting the processed data into one or more events, measuring the power consumed by the plurality of the endpoints using the interpreted data; and controlling the power consumption of the plurality of the endpoints using one or more applications.

The system for monitoring and controlling the power consumption, the system comprising plurality of the endpoints, plurality of the data aggregators, one or more gateway devices, a cloud server, and one or more communication devices integrated with one or more third-party applications.

These and other objects and advantages of the present invention will become readily apparent from the following detailed description.

BRIEF DESCRIPTION OF THE DRAWINGS

The other objects, features and advantages will occur to those skilled in the art from the following description of the preferred embodiment and the accompanying drawings in which:

FIG. 12a-FIG. 12c illustrates the working of a current sensor, according to an embodiment herein.

Figure 1:
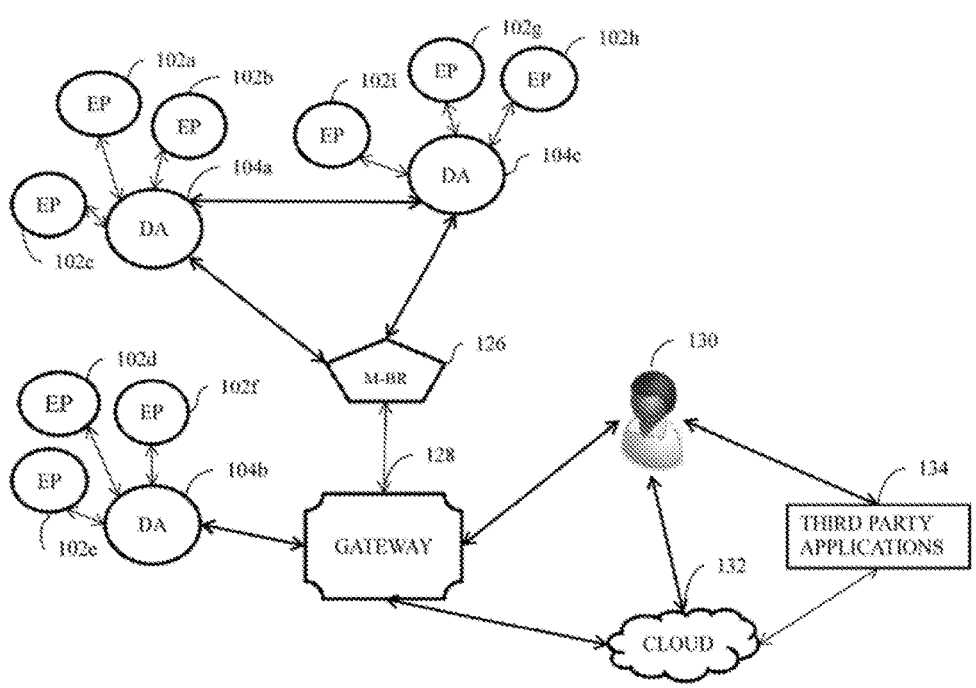
FIG. 1 illustrates a system block diagram of a system for measuring and controlling the power consumption at domestic and industrial setting, according to an embodiment herein.

Although the specific features of the present invention are shown in some drawings and not in others. This is done for convenience only as each feature nay be combined with any or all of the other features in accordance with the present invention.

DETAILED DESCRIPTION OF THE EMBODIMENTS HEREIN

In the following detailed description, these embodiments are described in sufficient detail to enable those skilled in the art to practice the embodiments and it is to be understood that the logical, mechanical and other changes may be made without departing from the scope of the embodiments. The following detailed description is therefore not to be taken in a limiting sense.

According to one embodiment herein, a method is provided for centralised monitoring and controlling power consumption of end user devices in network. The method comprising steps of receiving a raw data from plurality of end points using a data collecting devices, wherein the plurality of end points are connected with a plurality of operating devices or end user devices; measuring a plurality of operating and environmental parameters of the end user devices with a plurality of sensors; collecting and storing the received raw data and the measured plurality of operating and environmental parameters in a data aggregator device; processing the received raw data from the plurality of endpoints and the measured operating, and environmental parameters with a microcontroller unit; interpreting the processed data into one or more events with the microcontroller unit; measuring a power consumption of the plurality of end points using the microcontroller unit; optimizing and controlling the power consumption of the plurality of end points based on a preset setting and the measured and processed operating and environmental parameters using the microcontroller unit; and communicating the processed raw data and the measured operating and environmental parameters for storage in a database using one or more communication protocols for future retrieval and usage.

According to one embodiment herein, the raw data includes a poser consumption data load data, power factor data usage pattern over a monitoring time interval.

According to one embodiment herein, the measured operating and environmental parameters includes a current consumption, voltage level, environment temperature, humidity, ambient light flux, meteorological conditions, infra sonic frequency data, infrared transceiver data, gesture data, voice input, magnetic contact sensor data, motion sensor data, and door and window contact sensing data.

According to one embodiment herein, the processed raw data and the measured operating and environmental parameters are communicated using wireless and wired networks.

According to one embodiment herein, the processed raw data and the measured operating and environmental parameters are stored in a cloud and in a local gateway.

According to one embodiment herein, the end points are controlled in a centralised manner.

According to one embodiment herein, the microcontroller unit is stored with a plurality of applications to process the received raw data and measured operating and environmental parameters and to optimise and control the power consumption of the plurality of end points.

According to one embodiment herein the power consumption is controlled through a web application or a mobile application or any third party application.

According to one embodiment herein, the step of processing the plurality of raw data comprises providing a unique global identifier for each endpoint device; associating the data collected from the endpoint with the unique global identifier assigned to a respective end point device; mapping each unique global identifier of the endpoint device with the processed data corresponding to the end point device on a gateway device and a cloud server.

According to one embodiment herein, the method further generates a historical data, and a statistical data related a to a sensor data input related to each end point device.

According to one embodiment herein, a system is provided for monitoring and controlling power usage using one or more applications. The system comprises a plurality of data collecting devices connected to a plurality of end points connected to a plurality of operating devices or end user devices, wherein the plurality of data collecting devices receive a raw data from the plurality of operating devices; a plurality of sensors for measuring a plurality of operating and environmental parameters of the end user devices; a plurality of wired or wireless data aggregators for collecting and processing the raw data received from the plurality of end points and the plurality of measured operating and environmental parameters of the end user devices; one or more gateway devices for communicating between the plurality of wired or wireless data aggregators; and a cloud server for processing the raw data received from the plurality of end points and the plurality of measured operating and environmental parameters of the end user devices received from one or more gateway devices to optimize and control a power consumption of the plurality of end user devices.

According to one embodiment herein, the wireless or wired data aggregator comprises a personal area network manager for controlling a communication between the plurality of end user devices; and an end point interface manager and multiplexer, for interfacing with the plurality of the end points for collecting and forwarding the raw data received from the plurality of end user devices.

According to one embodiment herein, the gateway device comprises a cloud interface, in communication with the cloud database for accessing the data stored in the cloud database; a timer, for invoking one or more timed and scheduled events; a microcontroller, in communication with the plurality of wired or wireless data aggregators, configured for processing the plurality of raw data and the plurality of measured operating and environmental parameters of the end user devices; a control interface, in communication with the plurality of wired or wireless data aggregators, configured for interfacing with plurality of the end user devices; an input/output interface, for transferring the collected data between an internal storage device and an external storage device; a rule engine, for defining one or more actions on the plurality of the end user devices, wherein the plurality of actions are defined and estimated based on the plurality of raw data and the plurality of measured operating and environmental parameters of the end user devices; a localized machine learning module for controlling the plurality of end user devices automatically, based on the actions defined corresponding to a usage pattern; and a micro web server, in communication with the plurality of communication devices, for modifying the rules defined by the rule engine.

According to one embodiment herein, the cloud server comprises a main data storage module, for storing the plurality of data received from plurality of wired or wireless data aggregators, the data received from the plurality of end user devices and the data received from the plurality of gateway devices; an aggregate data storage module, for storing the aggregated data received from the main data storage module at a periodic time intervals; an off-line machine learning module, for controlling one or more endpoints automatically, by understanding the usage patterns and trends from a stored historical data; a reporting and querying module, for generating reports and queries; and API based interface, for defining a point of contact for all cloud related activities.

According to one embodiment herein, the raw data includes power consumption data, load data, power factor data, usage pattern over a monitoring time interval, and wherein the measured operating and environmental parameters includes a current consumption, voltage level, environment temperature, humidity, ambient light flux, meteorological conditions, infra sonic frequency data, infrared transceiver data, gesture data, voice input, magnetic contact sensor data, motion sensor data, and door and window contact sensing data.

The present invention provides a system and method for monitoring and controlling the power consumption at domestic and industrial setting. The present invention provides a method for monitoring and controlling power consumption at plurality endpoints. The method comprises, receiving raw data from plurality of endpoints, processing the raw data received from the plurality of the endpoints, communicating the processed data to a database using one or more protocols, interpreting the processed data into one or more events, measuring the power consumed by the plurality of the endpoints using the interpreted data; and controlling the power consumption of the plurality of the endpoints using one or more applications.

The system for monitoring and controlling the power consumption, the system comprising plurality of the endpoints, plurality of the data aggregators, one or more gateway devices, a cloud server, and one or more communication devices integrated with one or more third-party applications.

FIG. 1 illustrates a system block diagram of a system for measuring and controlling the power consumption at domestic and industrial setting, according to the various embodiments of the present invention.

The system block diagram includes plurality of endpoints 102a-102i. The plurality of the endpoints 102a-102i is embedded on one or more end user devices. Example of the end user devices include, but are not limited to, wall switches, lighting apparatus, heating and cooling apparatus, apparatus used for home security apparatus for providing shades, blinds, curtains, universally unique identifiers, and the like. In an embodiment, the plurality of the end points 102a-102i are embedded separately from the end user devices. In another embodiment, the plurality of the endpoints 102a-102i are embedded along with the end user devices. The plurality of the endpoints 102a-102i are identified using universally unique identifiers. Each of the end point are provided with a universally unique identifier. In an embodiment, the identifiers of the endpoint are identified using alphabets. In another embodiment, the identifiers of the endpoint are identified using numeric characteristics. In yet another embodiment, the identifiers of the endpoint are identified using alpha-numeric characteristics. The plurality of the endpoints 102a-102i transmit the data in the form of electric signals.

The system block diagram includes a data aggregator 104a that is either wired or wireless, a data aggregator 104b that is either wired or wireless, and a data aggregator 104c that is either wired or wireless. A data aggregator is a device that is transmits data between computer networks. The plurality data aggregators 104a-104c, are connected with plurality of the endpoints 102a-102i. The data aggregator 104a-104c receives and transmits data to the plurality of the endpoints using one or more protocols. Each of the data aggregator 104a-104c are identified using a unique identifier. The identifier used for identifying data aggregators are alphabets, numeric, alpha-numeric, or a combination of all, in an embodiment, the data aggregators 104a-104c are connected to each other to form clusters. In another embodiment, the plurality of the data aggregators 104a-104c are connected to a gateway. The plurality of the data aggregators 104a-104c communicate with each other using one or more data aggregating protocol. For example, the plurality of the border gateway protocol is a mobility support custom protocol.

The system block diagram includes a data aggregator specialized for handling multiple networks of similar or distinct protocols 126. The multi-border-router 126 is used to relay the processed information from plurality of data aggregators or a cluster of data aggregators to a gateway.

The system block diagram 100 includes a gateway 128. The gateway 128 is used for connecting plurality of the data aggregators 104a-104c or a cluster of data aggregators. The gateway 128 receives data from data aggregators and transmits the signals to each one of them to control one or more endpoints.

The system block diagram includes a user 130. The user 130 can control one or more end points by communicating with the gateway 128. The user 130 controls the one or more endpoints using a computable device having a communication network. Examples of a computable devices held by the user include, but are not limited to smartphones, tablet computers, desktop computers, laptop computers, phones connectable to internet, gaming consoles, wearable devices, electric field sensing devices and the like.

The system block diagram includes a cloud server 132. The cloud server 132 receives data from one or more sources and controls the one or more endpoints. The cloud server 132 includes an operating system and an interface to process the data received from plurality of sources and to store plurality of data.

The system block diagram includes a third-party applications 134. The third-party applications 134 are programmes written to work within operating systems, but are written by individuals or companies other than the provider of the operating systems. The third-party applications 134 can be a web application or a mobile application. The user 130, using the third-party applications 134 measures and controls the power consumed by the one or more operating circuits.

Figure 2:
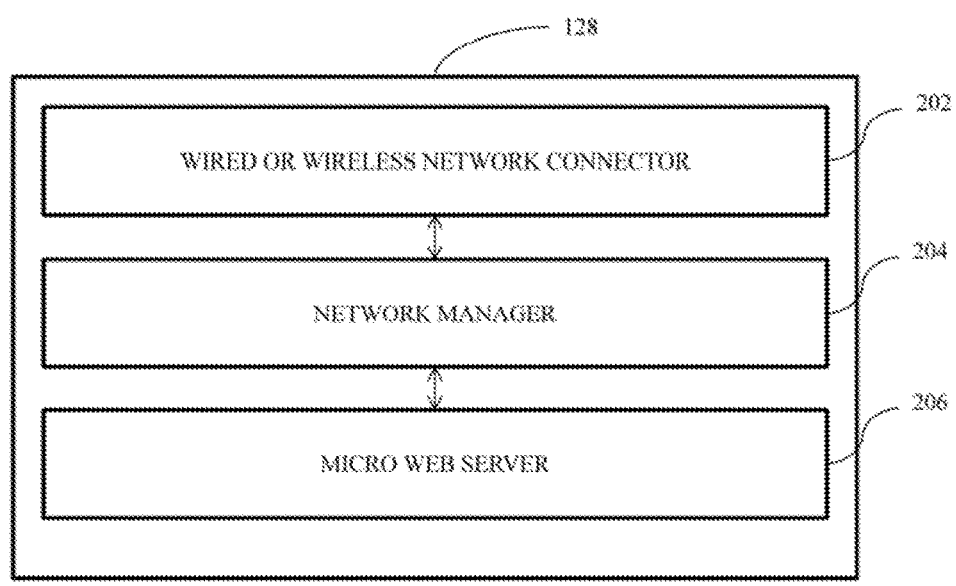
FIG. 2 illustrates the architecture of the gateway device, according to an embodiment herein.

FIG. 2 illustrates the architecture of the gateway 128, according to the various embodiments of the present invention. The gateway 128 connects to a communication network connector 202. The communication network can be a wired network or a wireless network. Examples of the communication network include, but are not limited to a local area network, wide area network, an interact, a public switched network, a telecommunication network, a wireless network, and a satellite network. The gateway 128 connects to the communication network connector 202 such as internet through an existing home network using an onboard Ethernet, or Wi-Fi interface. For home with existing internet connectivity, the gateway 128 uses a Universal Serial Bus (USB) interface where any 2G or 3G or 4G or CDMA enabled SIM or data cards could be used.

The gateway 128 includes a network manager 204. The network manager 204 enables the gateway 128 to detect and configure plurality of devices to automatically connect to the communication network. The functionality of the network manager 204 can be useful to both wireless and wired network. For wireless networks, the network manager 204 prefers known wireless networks and has the ability to switch to the most reliable network. The network manager 204 has the ability to manage both wired and wireless networks. The network manager 204 provides or denies connection to the network based on one or more pre-defined rules set by the gateway 128. Further the network manager 204 provides protection against threats, granting network access to one or more firewalls, denying network access to one or more firewalls, and the like. Further, the network manager 204 has separate protocols for managing upstream network, and downstream network. The upstream network comprises cloud server, other data aggregators and the like. The downstream network comprises the plurality of the endpoints 102a-102i.

The gateway 128 includes a micro web server 206. The micro web server 206 receives the data from one or more data and processes it. The micro web server 206 provides options to control one or more end points. The micro web server 206 acts as a local web server for processing the data received from the plurality of the end points. The micro web server 20 has two modes standalone mode and full access mode, in the standalone mode 206, the micro web server 206 has limited access and control, for monitoring and the controlling the one or more end points, in the full access mode, the micro web server 206 communicates with the cloud, for providing richer functionality and better monitoring and controlling of the power consumption at one or more end points.

The gateway 128 has different hardware and software implementation downstream personal area network connecting plurality of d aggregators, upstream Wi-Fi based connecting networks. Ethernet interface for home network connectivity, and USB interface for external data card interfacing and the like. The micro web server 206 has software implementation for automatic optimization of power consumption.

The gateway 128 is connected with one or more data aggregators, the cloud server 132, and to the user 130. The user can measure and control the power consumption of at the end points based on the inputs provided by the user 130 via the cloud 132 or by directly connecting to the gateway 128.

Figure 3:
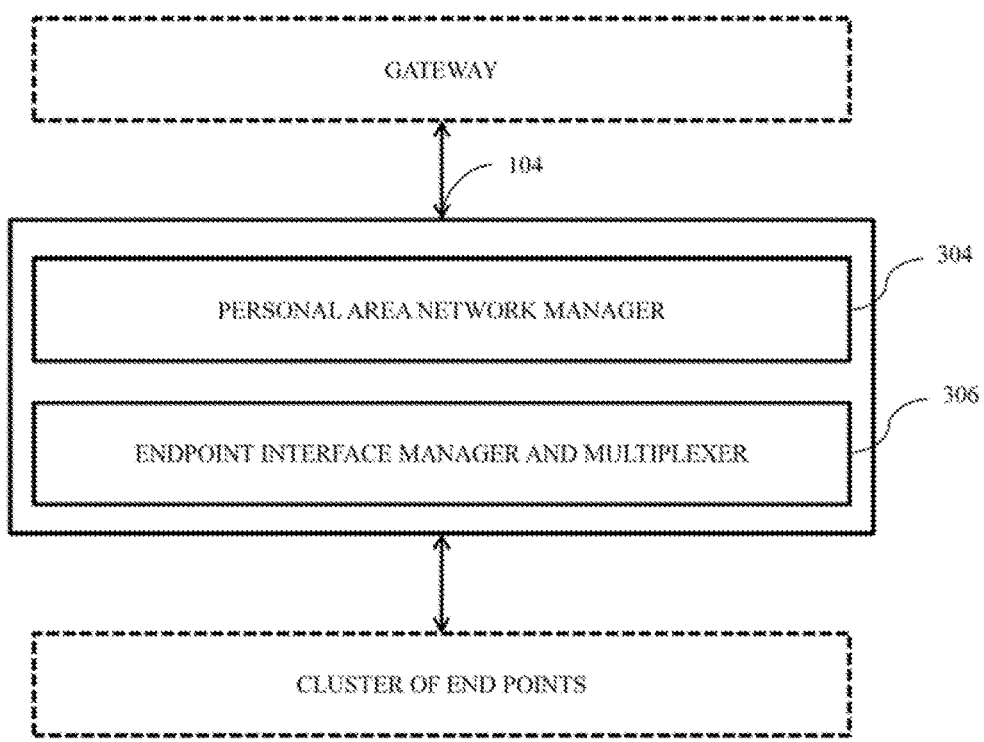
FIG. 3 illustrates the components of the data aggregator, according to an embodiment herein.

FIG. 3 illustrates the components of the data aggregator 104a-104c, according to various embodiments of the present invention. The plurality of the data aggregators 104a-104c serves two purposes. Firstly, the plurality of the data aggregators 104a-104c functions as a network extender. The data aggregator 104a-104c connects to the nearest reachable gateway or any other data aggregator to form a mesh network. Secondly, the plurality of the data aggregators 104a-104c also functions as an end point data aggregator. The plurality of the data aggregators 104a-104c gathers measured readings from one or more endpoints 102a-102i, controls and configures the one or more end user devices. The one or more endpoints communicate with the one or more data aggregators using one or more network protocols. Examples of the networks the data aggregators and the endpoints use for communicating include but are not limited to 6LoWPAN, INSTEON, ZIGBEE, Bluetooth Low Energy (BLE), Z-WAVE, POWERLINE, Wi-Fi, Bluetooth, Bluetooth 4.0, KNX, Radio Frequency (RF), and the like.

The data aggregator 104 includes a personal area network manager 304. The personal area network manager 304 has the ability to manage both wired and wireless networks. The data aggregator 104 includes an endpoint manager and multiplexer 306. The endpoint manager and multiplexer 306 receives the input from plurality of the endpoints and also manages the data exchange protocol between data aggregator 104 and the end points 102.

Further, the data aggregator 104a-104c periodically collects the measured data from the plurality of the endpoints and health status from all the endpoints connected to it.

Figure 4:
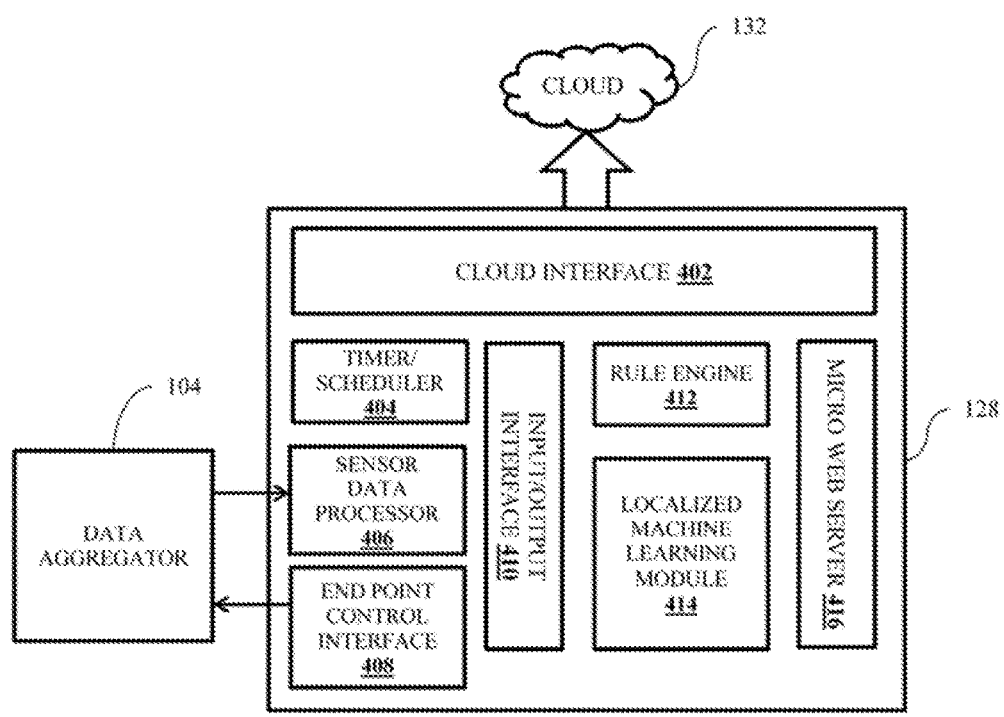
FIG. 4 illustrates the various modules of the gateway device, according to an embodiment herein.

FIG. 4 illustrates the various modules of the gateway 128, according to various embodiments of the present invention. The gateway 128 comprises one or more modules for communicating with the plurality of the endpoints, cloud server, and the user, with or without the help of the third party applications. The gateway 128 includes a cloud interface module 402. The cloud interface module 402 is to communicate with the cloud server 132. The cloud interface module 402 has one or more protocols to communicate with the cloud 132. The cloud interface module 402 provides the data to the cloud 132 for storage of the data provided by plurality of the endpoints 102 and the plurality of the data aggregators 104a-104c. Further, the user 130 gives one or more control commands to control the plurality of the endpoints using the cloud interface module 402.

The gateway 132 includes a micro web server 416. The micro web server 416 is a lightweight and fast webserver that allows control of the plurality of the endpoints. The micro web server 416 has necessary features to show live and limited historical usage data patters and trends. The micro web server 416 can be accesses using any conventional browser present in computing devices. Apart from the browsers, the micro web server 416 can be accessed from dedicated third party applications from one or more computing devices. The micro web server 416 allows user 130 to add, modify and change rules for controlling the plurality of the endpoints 102.

The gateway 128 includes a rule engine 412. The rule engine 412 stores the one or more rules for monitoring and controlling the power consumption at the plurality of the endpoints. The rule engine 412 has various rules describing the action on a particular endpoint based on the endpoint. For example a rule can state: when motion is detected by the endpoint 1 at room 1, switch on the power at endpoint 5. The rules set by the rule engine 412 can be an explicit rule, that are described to act upon the data readings obtained from the endpoints. Apart from explicit rules, the rule engine 416 can learn rules for automatic control of the plurality of the endpoints.

The gateway 128 includes a localized machine learning module 414. The localized machine learning module 414 does advanced usage pattern learning to do automatic control of the plurality of the endpoints.

The gateway 128 includes a timer/scheduler 404. The timer/scheduler is used for invoking one or more actions at the plurality of the endpoints. The timer/scheduler 404 will schedule one or more events according to one or more rules set h the rule engine 412 and the usage pattern learning 416. For proper functioning of both the rule engine 412 and the localized machine learning module 414, tuner scheduler 404 for invoking timed and scheduled events.

The gateway 128 includes a sensor data processor 406. The sensor data processor 406 interacts with the one or more data aggregators 104 to receive the data of the plurality of the endpoints 102. The gateway 128 includes, an endpoint control interface 408. The endpoint control interface 408 interfaces with the data aggregators by providing processed and filter endpoint data.

The gateway 128 includes an input/output interface 410. The input/output interface 410 provides an abstracted input output call irrespective of the lower level modules. The gateway 128 is either connected to a cloud 132 or to other gateways for monitoring and controlling the power consumption.

Figure 5A:
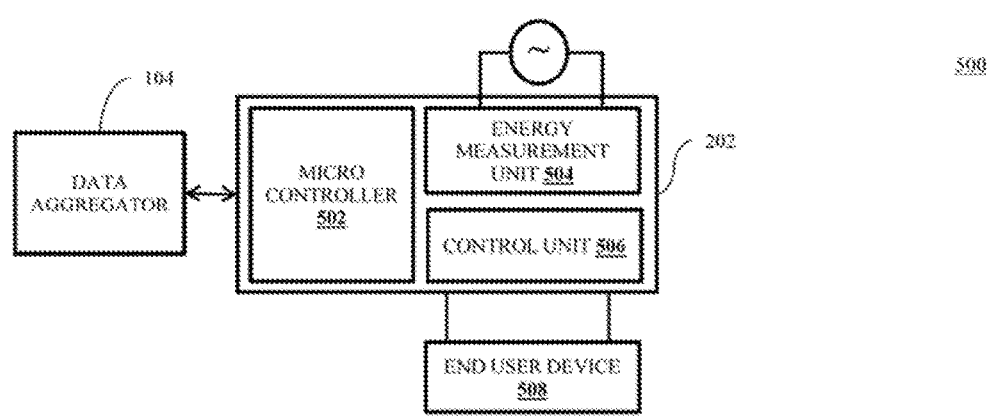
FIG. 5a and FIG. 5b illustrate the architecture of the endpoints, according to an embodiment herein.
Figure 5B:
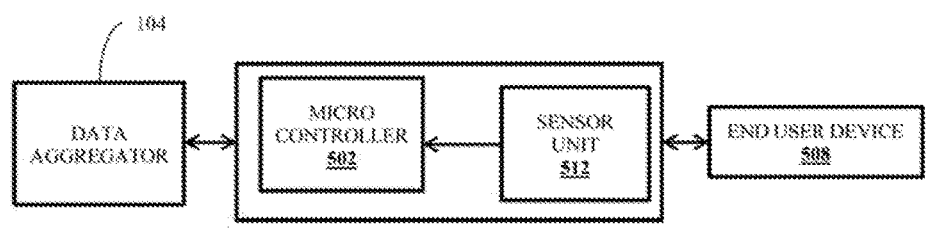

FIG. 5a and FIG. 5b shows the architecture of the endpoints. FIG. 5a and FIG. 5b is an endpoint of the plurality of the endpoints. FIG. 5a shows an embodiment of the endpoint 102 having a sensing unit and a measuring unit. The endpoints 102a-102c are connected to one or more data aggregators to provide data and receive instructions for measuring and controlling the power consumption. FIG. 5a includes a microcontroller 502. The microcontroller 502 receives the electrical signals from the one or more operating circuits 508. The microcontroller 502 processes the received electrical signals and sends the processed signals to an energy measurement unit 504. The energy measurement unit 504 measures the energy consumed by the endpoint and sends it to a control unit 506. The control unit 506, controls the power consumption of the operating circuit 508, as directed by the user 130, or by the rules set by the rule engine 412.

FIG. 5b illustrates another embodiment of the endpoints of the one or more endpoints 102a-102i having only a sensing unit FIG. 5b includes a microcontroller 502. The microcontroller 502 receives the data from an end user device 516, processes the received data and provides it to the one or more data aggregators. The FIG. 5b includes a sensing unit 512. The sensing unit is used for sensing one or more real time situations. Examples of the real time situations include temperature sensing, humidity sensing, motion sensing and the like. The reading from the sensor unit 512 is used to control one or more end user device 516. The mapping between the endpoint and control units are done in software. The mapping and control logic is implemented at the micro webserver of the gateway 128.

Figure 6:
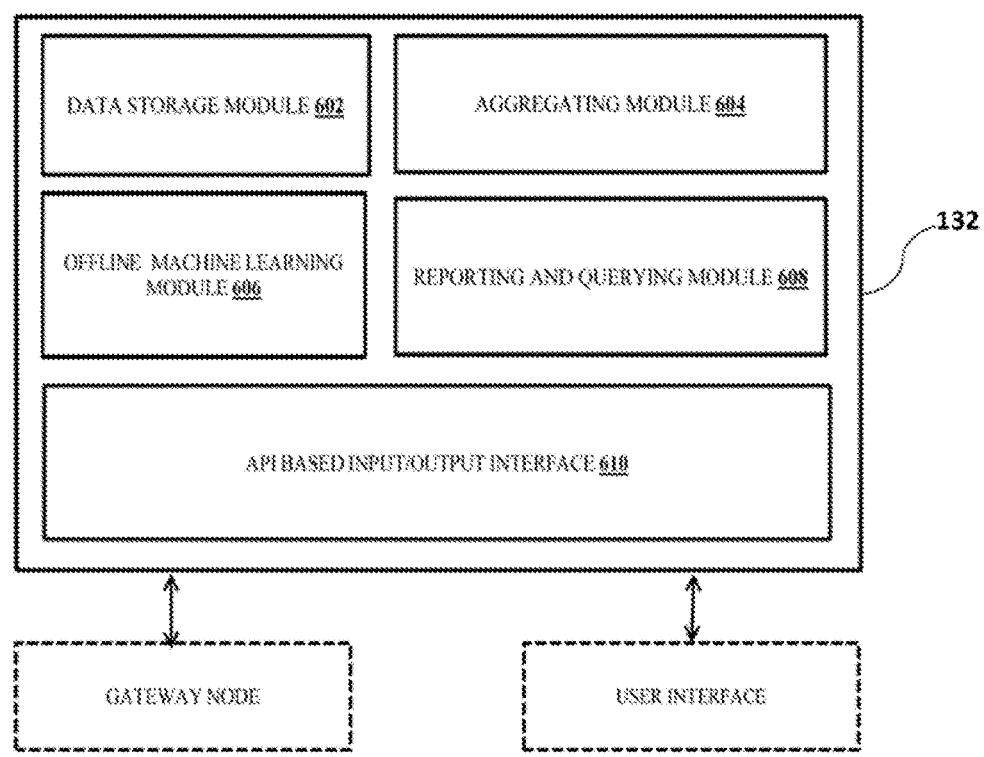
FIG. 6 illustrates the architecture of the cloud server, according to an embodiment herein.

FIG. 6 illustrates the architecture of the cloud server, according to various embodiments of the present invention. The cloud server 132 includes a data storage module 602. The data storage module 602 stores plurality of data provided by plurality of devices. The data stored by the data storage module 602 include, but not limited to device identifiers of the plurality of the endpoints, device identifiers of the plurality of data aggregators, inputs provided by the plurality of the endpoints, device identifiers of the users, identifiers of the plurality of the third-party integrated applications and the like.

The cloud server 132 includes a data aggregating module 604. The data aggregating module 604 aggregates and stores the timely aggregates from the data storage module 602. The data aggregating module 604 is implemented to speed up the queries as most of the queries can be answered using the aggregates and avoiding full table scan.

The cloud server 132 includes an offline machine learning module 606. The offline machine learning module 606 understands the usage patterns of plurality of the endpoints, and monitors and controls accordingly. The offline machine learning module 606 learns usage patterns and trends from a larger set of historical data stored in the data storage module 602. The offline machine learning module 606 also correlates the usage data over various deployments.

The cloud server 132 includes a reporting and querying module 608. The reporting and the querying module 608 provides necessary functionality for generating reports and queries. The reporting and querying module 608 provides visual reports on the collected data.

The cloud server 132 includes an API (Application Programming Interface) based input/output interface 610. The API based input output interface 610 acts as single point of contact for all cloud related activities. The API based input output interface 610 receives the required action via API calls and invokes the required modules internally to complete the task. Thus, the API based input/output interface 610 abstracts away the actual implementation of the modules within the cloud server 132.

Figure 7:
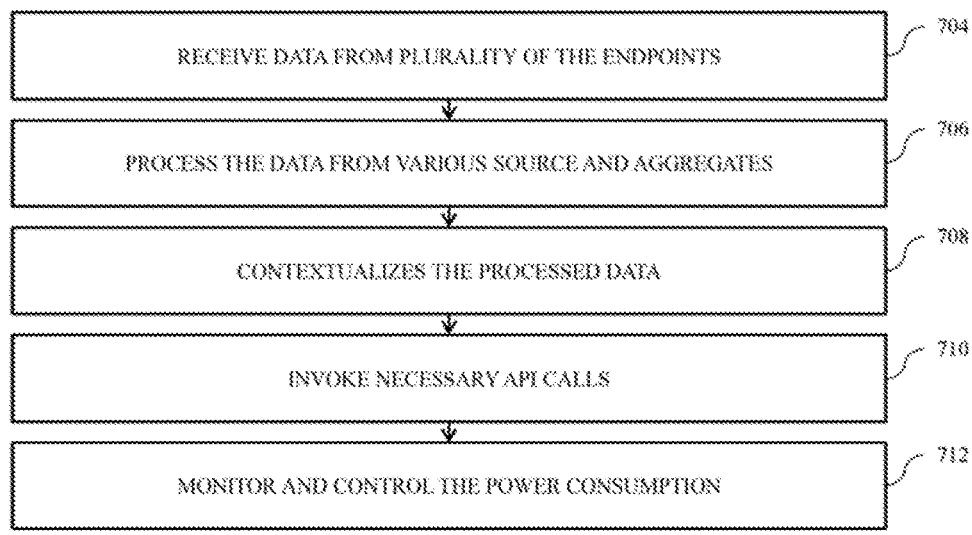
FIG. 7 illustrates the flowchart for monitoring and controlling the power consumption at domestic and industrial setting, according to an embodiment herein.

FIG. 7, illustrates a flowchart for monitoring and controlling the power consumption, according to the various embodiments of the present invention. At step 704, the plurality of the endpoints receive input data from plurality of the end user devices. The received inputs are in the form of the electrical signals. The plurality of the endpoints receive the signals from the plurality of the end user devices and transmits to further stage for processing. The inputs can be temperature, motion, humidity and the like. The analogue signals are converted to digital signals by the endpoints. Each of the endpoint is provided with a universally unique identifier for identifying the end user device.

At step 706, the received, data is processes by the data aggregators. Processing of the data includes, receiving the data, matching the device identifiers, and aggregating the data from one or more sources.

At step 708, the gateway receives the processed data and contextualizes the aggregated data. Contextualization of the aggregated data include but limited to tagging the data with meta-information. Within the gateway the contextualized data is consumed by the rule engine, machine learning module, and the web server to understand the usage pattern to monitor and control the power consumption effectively.

At step 710, the web server consumes the contextualized data, whenever a use invokes data reporting or querying using the functionalities provided by the web server. The contextualized data is also sent via the cloud interface of the gateway to the cloud. The cloud interface present at the gateway invokes the necessary API calls to the API interface of the cloud. The API interface at the cloud then stores the data using the storage module. At the cloud, the data may be used by the data aggregating module and the office machine learning module. Further, the user queries the historical or statistical data from the cloud server's reporting and querying module using the API interface of the cloud. The flowchart terminates at the step 712.

Figure 8A:
FIG. 8a and FIG. 8b illustrate a working of an air quality sensor, according to an embodiment herein.
Figure 8B:
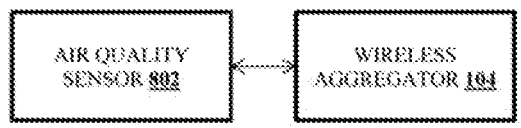

FIG. 8a and FIG. 8b illustrates the working of an air quality sensor 802, according to various embodiments of the present invention. The air quality sensor is used for environmental monitoring, gas leak detection, and the like. The air quality sensor 802 actively monitors the air quality by calculating the levels and concentration of gases and forward the readings to the data aggregator 104.

FIG. 8a illustrates the air quality sensor 802 providing inputs to the data aggregator 104 through the micro controller 502. The micro controller 502 process the inputs received and transmits the processed data to the data aggregator 116.

FIG. 8b illustrates the air quality sensor 802 sensing the air quality by providing the inputs directly to the data aggregator 104. The air sensor 802 can detects gases like Carbon Monoxide, Methane, Carbon-di-oxide, Oxygen, and the like.

Figure 9:
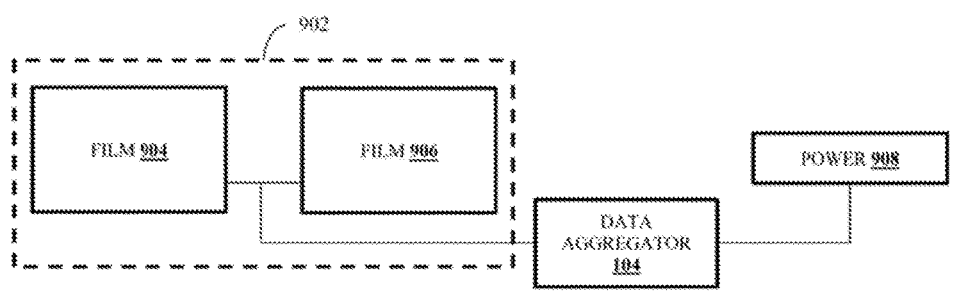
FIG. 9 illustrates a block diagram of shading controller for controlling glass windows, doors, and projection screen, according to an embodiment herein.

FIG. 9 illustrates a smart-film sensor 902 for controlling the shading capacity, according to various embodiments of the present invention. The FIG. 9 includes a smart film 904, and a smart film 906. A smart film is the one which is opaque when powered off and clear when powered on. The smart film blocks ultra-violet, and colour heat. Between the smart film 904 and 906, there is a liquid crystal layer. The bottom most layer is adhesive to stick to the glass. A smart film sensor 902, provides the inputs to the data aggregator 104. The data aggregator 104 is connected to the power module 908. The data aggregator 104, based on the pre-determined rules set by the user 130, and the rules set by the automated learning module 606, the shading and the tint quality is controlled.

Figure 10:
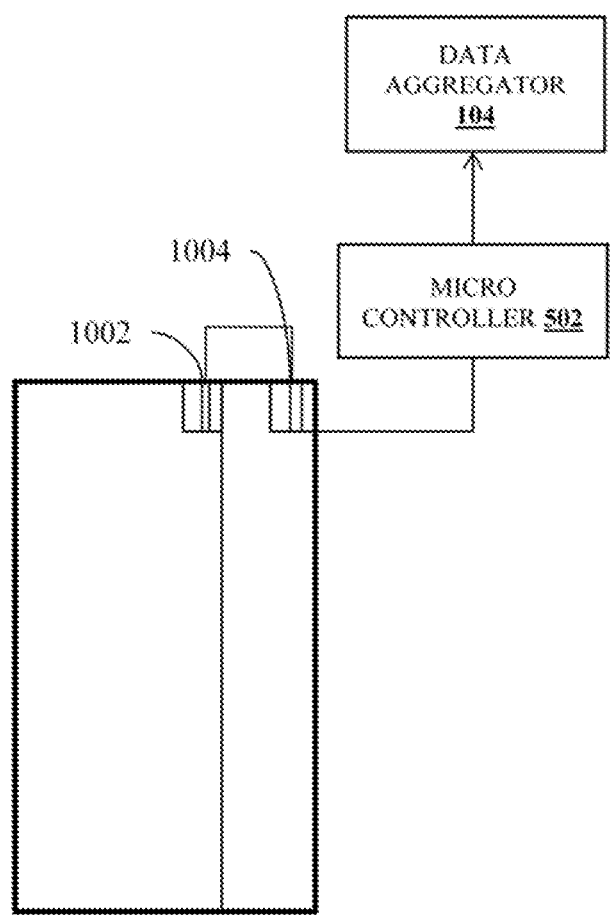
FIG. 10 illustrates the working of magnetic notification sensor, according to an embodiment herein.

FIG. 10 illustrates a magnetic notification sensor. The magnetic notification sensor to notify if an object such as a door is opened or closed. The magnetic notification sensor includes two components a component 1002, and a component 1004. When the component 1002, and the component 1004 is in contact, the circuit is completed and the microcontroller 502 forwards the relevant data to the data aggregator 104. The data aggregator 104, based on the pre-determined rules set by the user 130, and the rules set by the automated learning module 606, the shading and the tint quality is controlled.

Figure 11A:
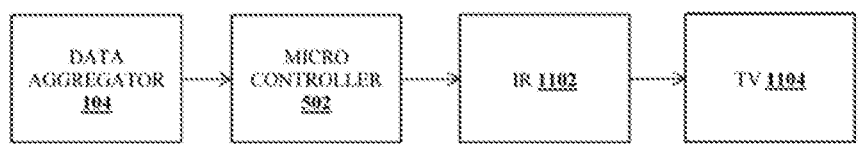
FIG. 11a-FIG. 11b illustrates the working of an infrared transceiver, according to an embodiment herein.

FIG. 11a illustrates an infrared transceiver circuit. The infrared transceiver is used for controlling one or more appliances such as television, air conditioner, entertainment systems based on IR-based remotes. The command received from the data aggregator 104 is converted to the relevant infrared waveforms and transmitted to the appliance.

Figure 11B:

Similarly, the FIG. 11b illustrates the transceiver for receiving the IR signals. The IR 1102 converts the IR signals from the remote 1106 to the signals understandable by the micro controller 502. The micro controller 502 processes the signals and transmits to the data aggregator 104.

FIG. 12a illustrates a current sensor. The current sensor is used to get readings, to send control signals, to dim the intensity of the intensity of non-inductive loads. The current sensor includes a bottom board 1210 for sensing. The bottom board 1210 comprises mostly digital components.

FIG. 12b illustrates a sensing module. The sensing board includes a chip shunt resistor 1214. The chip shunt resistor 1214 provides raw values for current and voltage which are passed to a meteorology unit 1202. The meteorology unit 1202 measures active, reactive, and apparent energies currents, voltage RMS and instantaneous measurement. The micro controller 502 processes the values received from the meteorology unit 1202 and stores them in data registers to transfers to the wired or wireless modules. The recordings are forwarded to the data aggregator 104.

FIG. 12c illustrates the components of an actuation and dimming board. The actuation and dimming board include a micro controller 502. The micro controller 502 sends the signals to an opto-coupler 1204. The opto-coupler 1204 is used for dimming the load through phase control. The dimming and actuation board includes a TRIAC 1206. The TRAIC 1206 of a higher value is used for controlling heavy appliances. The actuation and dimming board includes an AC LOAD 1208. The AC LOAD 1208 can be a television, radio, and the like.

Figure 13:
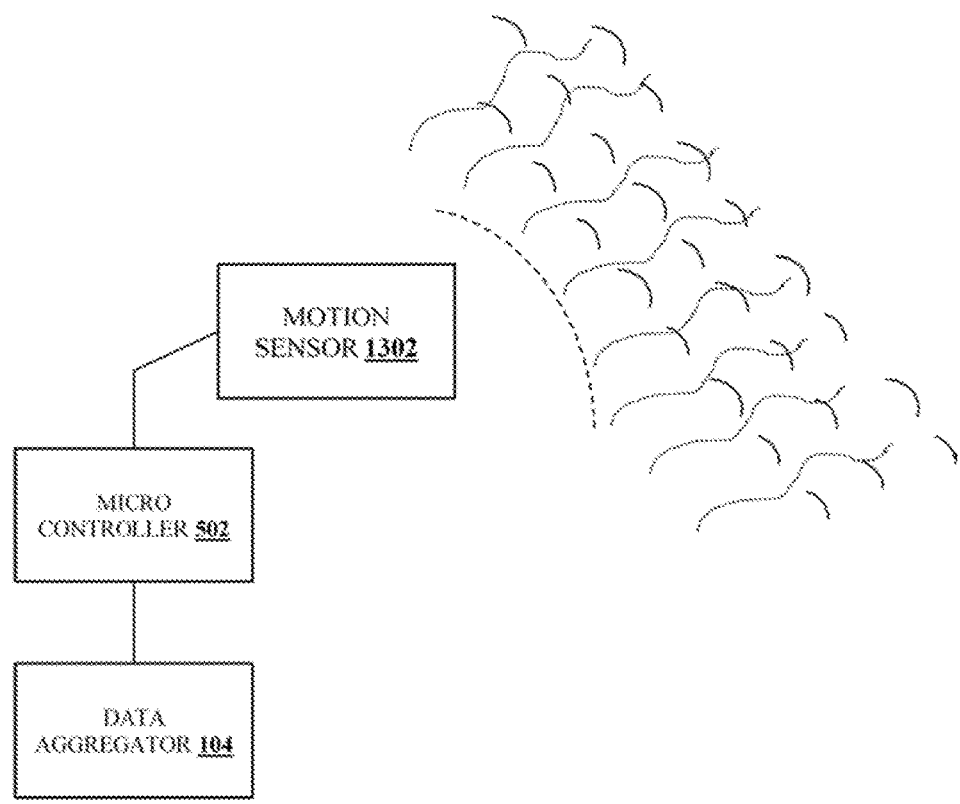
FIG. 13 illustrates the working of a motion sensor, according to an embodiment herein.

FIG. 13 illustrates the operation of a motion sensor, according to various embodiments of the present invention. The motion sensor is used for detecting occurrence of motion, room occupancy, alerting and the like. Examples of motion sensors include, but are not limited to passive infrared, active infrared, ultrasonic, subsonic, passive audio/acoustic, and the like.

Depending on the type of the application, the relevant sensor module is interfaced with the micro controller 502, which processes the readings and forwards it to the data aggregator 104.

The sensor modules of different types can be combined in a single unit for diverse applications based on motion detection. For example, a combined module with infrared, sonic, and acoustic sensors interfaced to a single micro controller 502 can be connected to a data aggregator 104.

Figure 14:
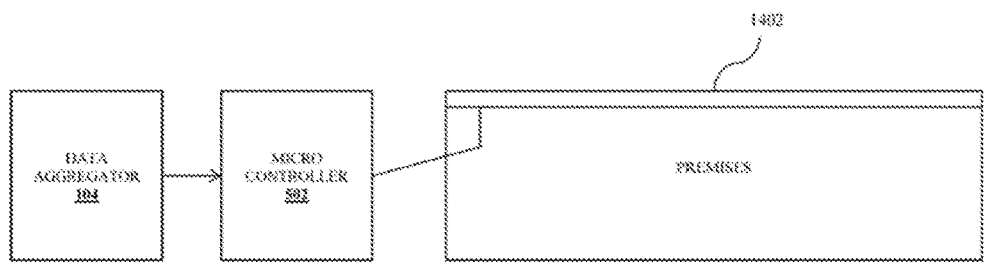
FIG. 14 illustrates an intrusion detection sensor, according to an embodiment herein.

FIG. 14 illustrates an intrusion detection sensor. The intrusion detection sensor detects intrusion in fences, windows, and the like. The sensor modules 1402 are connected to a premise. Examples of premises can include but are not limited to the fences, windows, doors, and the like. The connected sensor modules are interfaced with the microcontroller 502 connected to the data aggregator 116. In case of an intrusion, the sensor sends the relevant readings that are forwarded to the data aggregator 116 for processing and getting actionable results.

Figure 15:
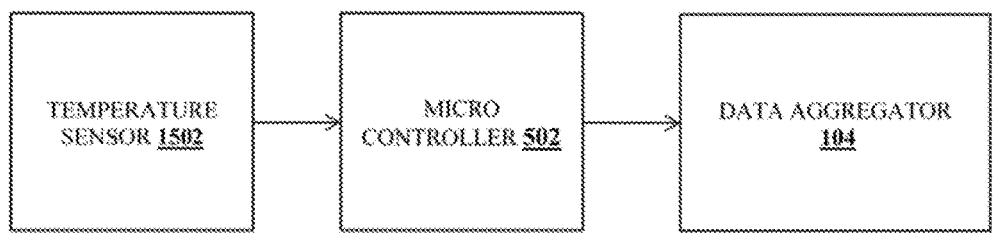
FIG. 15 illustrates a temperature sensor, according to an embodiment herein.

FIG. 15 illustrates the operation of a temperature sensor, according to various embodiments of the present invention. The temperature sensor 1502 is used for monitoring, environmental temperature. The temperature sensor 1502 can be wall mounted or dynamically placed anywhere. The values read by the temperature sensor 1502 are forwarded to the data aggregator 104 through the micro controller 502.

Figure 16A:
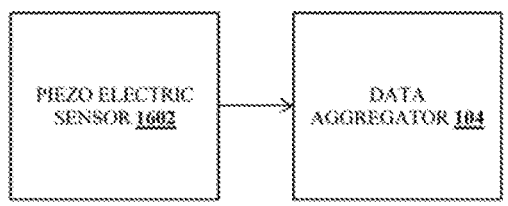
FIG. 16a-FIG. 16b illustrates a piezo-electric sensor, according to an embodiment herein.
Figure 16B:
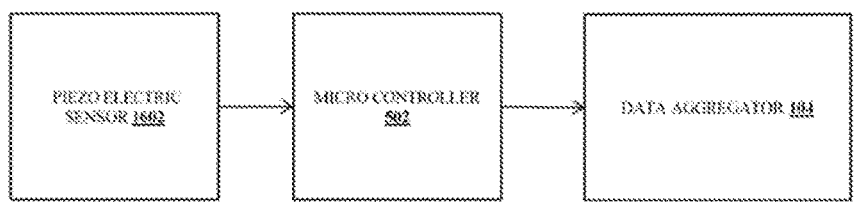

FIG. 16a and FIG. 16b illustrates the working of a piezo electric sensor 1602. The piezo electric sensor 1602 is used for detecting vibrations in the connecting surface. The readings detected by the piezo electric sensor 1602 are processed in the micro controller 502, and is transmitted to the data aggregator 104.

Figure 17:
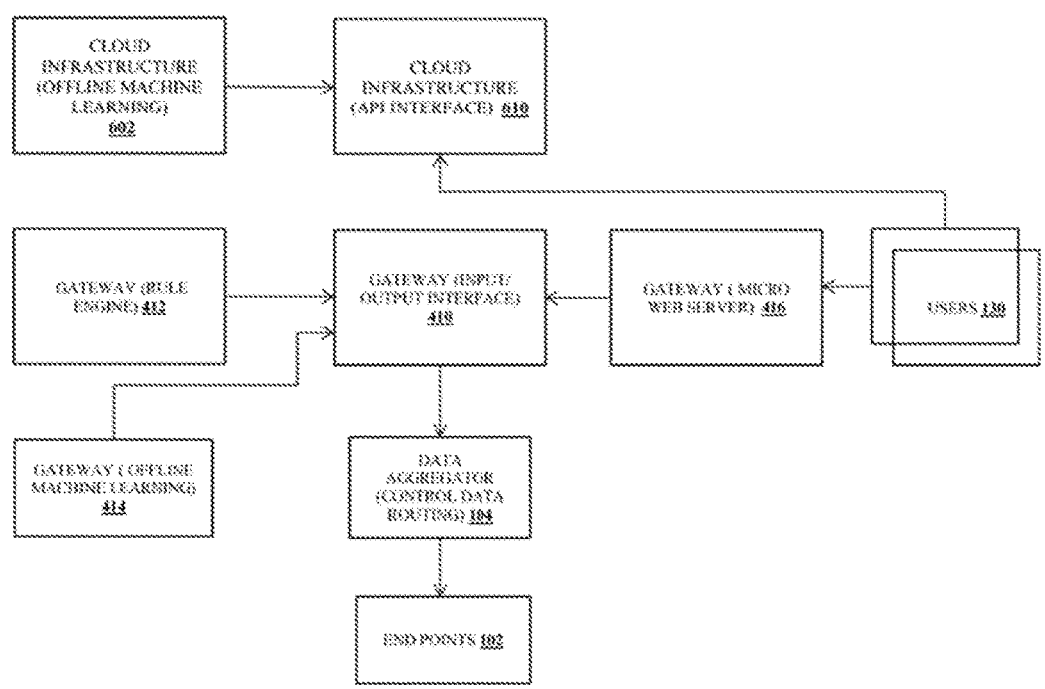
FIG. 17 illustrates a control flow diagram for measuring and monitoring power consumption, according to an embodiment herein.

FIG. 17 shows the control information flow diagram. The control information relates to the information regarding the control of plurality of the endpoints 102 including but not limited to switching ON/OFF, changing endpoint settings. There can be various sources for control information. The manual source comes from user 130. The user 130 could send control information via the web server 416 present in the gateway 128 or via the API interface 610 of the cloud. In both the cases the control information arrives at the input output interface of the gateway 128. The automatic source could be the rule engine 412 the machine learning module present in the gateway 128 and the offline machine learning module at the cloud 602. Whenever a rule inside the rule engine 412 is triggered, the corresponding control command/information is sent by the rule engine 412 to the gateway output interface 410 which in return passes it down to the endpoints 102 via data aggregators 104. The machine learning module present in the gateway 414 or the offline machine learning module present in the cloud 602 also could send control commands based on advanced pattern analysis over the historical or current data.

The advantage of the present invention is that, it allows the monitoring and controlling the operating circuits using a web application or a mobile application.

Yet another advantage of the present invention is that, it allows the user to view the historical data and obtain the statistics of the power consumption in a graphical manner.

Yet another advantage of the present invention is that, it allows the user to control and monitor power consumption of the operating circuits, with or without having the access to a cloud server.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

Although the embodiments herein are described with various specific embodiments, it will be obvious for a person skilled in the an to practice the invention with modifications. However, all such modifications are deemed to be within the scope of the claims.

What is claimed is:

1. A computer implemented method comprising computer readable instructions stored on a non-transitory computer readable medium and executed on a computing device comprising hardware processor and a memory, for centralised monitoring and controlling power consumption of end user devices in network through one or more algorithms or software applications, the method comprising steps of:
    receiving a raw data from plurality of end points with a plurality of data collecting devices through a software application, wherein the plurality of end points are connected with a plurality of operating devices or end user devices;
    measuring a plurality of operating and environmental parameters of the end user devices with a plurality of sensors;
    collecting and storing the received raw data and the measured plurality of operating and environmental parameters in a data aggregator device with a cloud server;
    processing the received raw data from the plurality of endpoints and the measured operating and environmental parameters with a microcontroller unit using one or more software applications;
    interpreting the processed data into one or more events with the microcontroller unit using one or more software applications;
    measuring a power consumption of the plurality of end points using an energy measuring unit;
    optimizing and controlling the power consumption of the plurality of end points by a control unit based on a preset setting set by a rule engine and the measured and processed operating and environmental parameters using the microcontroller unit; and
    communicating the processed raw data and the measured operating, and environmental parameters for storage in a database using one or more communication protocols for future retrieval and usage;
    wherein the raw data includes a power consumption data, load data, power factor data, usage pattern over a monitoring time interval, and wherein the measured operating and environmental parameters includes a current consumption, voltage level, environment temperature, humidity, ambient light flux, meteorological conditions, infra sonic frequency data, infrared transceiver data, gesture data, voice input, magnetic contact sensor data, motion sensor data, and door and window contact sensing data.

2. The method according to claim 1, wherein the processed raw data and the measured operating and environmental parameters are communicated using wireless and wired networks.

3. The method according to claim 1, wherein the processed raw data and the measured operating and environmental parameters are stored in a cloud and in a local gateway.

4. The method according to claim 1, wherein the end points are controlled in a centralised manner.

5. The method according to claim 1, wherein the microcontroller unit is stored with a plurality of applications to process the received raw data and measured operating and environmental parameters and, to optimise and control the power consumption of the plurality of end points.

6. The method according to claim 1, wherein the power consumption is controlled through a web application or a mobile application or any third party application.

7. The method according to claim 1, wherein the step of processing the plurality of raw data comprises:
    providing a unique global identifier for each endpoint device;
    associating the data collected from the endpoint with the unique global identifier assigned to a respective end point device;
    mapping each unique global identifier of the endpoint device with the processed data corresponding to the end point device on a gateway device and a cloud server.

8. The method as claimed in claim 1, further generates a historical data, and a statistical data related a to a sensor data input related to each end point device.

9. A system for monitoring and controlling power usage using one or more applications, the system comprising:
    a plurality of data collecting devices connected to a plurality of end points connected to a plurality of operating devices or end user devices, wherein the plurality of data collecting devices is configured to receive a raw data from the plurality of operating devices using a software application;
    a plurality of sensors configured for measuring a plurality of operating and environmental parameters of the end user devices;
    a plurality of wired or wireless data aggregators configured for collecting and processing the raw data received from the plurality of end points and the plurality of measured operating and environmental parameters of the end user devices using one or more software applications;
    one or more gateway devices configured for communicating between the plurality of wired or wireless data aggregators through one or more communication protocols;
    a cloud server configured for processing the raw data received from the plurality of end points and the plurality of measured operating and environmental parameters of the end user devices received from one or more gateway devices to optimize and control a power consumption of the plurality of end user devices through a control unit;

wherein the wireless or wired data aggregator comprises:
- a personal area network manager configured for controlling a communication between the plurality of end user devices; and
- an end point interface manager and multiplexer, configured for interfacing with the plurality of the end points for collecting and forwarding the raw data received from the plurality of end user devices;

wherein the gateway device comprises:
- a cloud interface, in communication with the cloud database and configured for accessing the data stored in the cloud database;
- a timer, configured for invoking one or more timed and scheduled events;
- a microcontroller, in communication with the plurality of wired or wireless data aggregators, and configured for processing the plurality of raw data and the plurality of measured operating and environmental parameters of the end user devices;
- a control interface, in communication with the plurality of wired or wireless data aggregators, and configured for interfacing with plurality of the end user devices;
- an input/output interface, configured for transferring the collected data between an internal storage device and an external storage device;
- a rule engine, configured for defining one or more actions on the plurality of the end user devices, wherein the plurality of actions are defined and estimated based on the plurality of raw data and the plurality of measured operating and environmental parameters of the end user devices;
- a localized machine learning module configured for controlling the plurality of end user devices automatically, based on the actions defined corresponding to a usage patter; and
- a micro web server, in communication with the plurality of communication devices, and configured for modifying the rules defined by the rule engine;

wherein the cloud server comprises;
- a main data storage module, configured for storing the plurality of data received from plurality of wired or wireless data aggregators, the data received from the plurality of end user devices and the data received from the plurality of gateway devices;
- an aggregate data storage module, configured for storing the aggregated data received from the main data storage module at periodic time intervals;
- an off-line machine learning module, configured for controlling one or more endpoints automatically, by understanding the usage patterns and trends from a stored historical data;
- a reporting and querying module, configured for generating reports and queries; and
- API based interface, configured for defining a point of contact for all cloud related activities; and wherein the raw data includes a power consumption data, load data, power factor data, usage pattern over a monitoring time interval, and wherein the measured operating and environmental parameters includes a current consumption, voltage level, environment temperature, humidity, ambient light flux, meteorological conditions, infra sonic frequency data, infrared transceiver data, gesture data, voice input, magnetic contact sensor data, motion sensor data, and door and window contact sensing data.

* * * * *